(12) United States Patent
Pannetier et al.

(10) Patent No.: US 7,342,396 B2
(45) Date of Patent: Mar. 11, 2008

(54) DEVICE FOR SENSING A MAGNETIC FIELD

(75) Inventors: Myriam Pannetier, Bures sur Yvette (FR); Claude Fermon, Orsay (FR); Juha Simola, Helsinki (FI)

(73) Assignees: Commissariat Energie Atomique, Paris (FR); Elekta Neuromag Oy, Helsinki (FI)

( * ) Notice: Subject to any disclaimer, the term of this patent is extended or adjusted under 35 U.S.C. 154(b) by 112 days.

(21) Appl. No.: 10/543,982

(22) PCT Filed: Jan. 31, 2003

(86) PCT No.: PCT/EP03/01518

§ 371 (c)(1),
(2), (4) Date: May 10, 2006

(87) PCT Pub. No.: WO2004/068158

PCT Pub. Date: Aug. 12, 2004

(65) Prior Publication Data

US 2006/0220641 A1    Oct. 5, 2006

(51) Int. Cl.
  *G01R 33/035* (2006.01)
  *G01R 33/09* (2006.01)

(52) U.S. Cl. .................................. 324/248; 324/252

(58) Field of Classification Search ............... 324/244, 324/248, 249, 251, 252, 258, 260; 327/527; 505/162, 845
See application file for complete search history.

(56) References Cited

U.S. PATENT DOCUMENTS 4,491,795 A * 1/1985 Gelinas ..................... 324/248

FOREIGN PATENT DOCUMENTS

DE  199 44 586 C  12/2000
DE  100 41 797 A1  5/2001

(Continued)

OTHER PUBLICATIONS

Cantor, R., et al.: "Low-Noise, Single-Layer $YBa_2Cu_3O_{7-x}$ DC Squid Magnetometers at 77 K" IEEE Transactions on Applied Superconductivity, vol. 5, No. 2, Jun. 1995, pp. 2927-2930.

(Continued)

*Primary Examiner*—Reena Aurora
*Assistant Examiner*—Kenneth J Whittington
(74) *Attorney, Agent, or Firm*—Weingarten, Schurgin, Gagnebin & Lebovici LLP

(57) ABSTRACT

The device for sensing a magnetic field comprises a closed superconducting pick-up loop (1) having a path width (d) etched out of a single layer superconducting thin film and provided with a constriction (15) having a width (w) of narrow dimension smaller than the path width (d). The closed superconducting pick-up loop (1) constitutes a flux-to-field transformer (FFDT). At least one magnetoresistive element (2) is placed on top of or below the superconducting thin film, is isolated from the superconducting thin film by a thin insulating layer and is located so that an active part of the magnetoresistive element (2) is at the location of the constriction (15) and has a width equal to or less than the width of the constriction (15). The active part of the magnetoresistive element (2) is oriented so that the bias current in this active part is directed essentially along the constriction (15), orthogonally to the width of narrow dimension.

25 Claims, 2 Drawing Sheets

FOREIGN PATENT DOCUMENTS

GB 2213267 * 9/1988

OTHER PUBLICATIONS

Kaiser, G. et al: "First experimental investigations on a thin film Hall magnetometer with a high temperature superconducting pick-up antenna," CRYOGENICS, vol. 38, No. 6, pp. 625-629, (1998).

Robbes, D. et al: "Highly Sensitive Uncooled Magnetometers: *State of the Art. Superconducting Magnetic Hybrid Magnetometers, an alternative to SQUIDs?*" IEEE Transactions on Applied Superconductivity, IEEE Inc., New York, US, vol. 11, No. 1, Mar. 2001, pp. 629-634.

* cited by examiner

DEVICE FOR SENSING A MAGNETIC FIELD

This application is a §371 national phase filing of PCT/EP2003/001518 filed Jan. 31, 2003.

FIELD OF THE INVENTION

The invention relates to a device for sensing a magnetic field.

More specifically, the invention relates to a sensor of magnetic flux using a superconducting pick-up loop.

Thus the sensor can be used in any magnetic sensor application where the cooling of the sensor to below the superconducting transition temperature $T_c$ of the superconducting loop is possible.

DESCRIPTION OF THE RELATED ART

Magnetic sensors are routinely used in many technical applications such as position, velocity, acceleration, and angle detectors, for example. There is a large variety of magnetic sensor types based on different physical principles. The prior art relevant to the present invention comprises two kind of sensors: magnetoresistive (MR) sensors, and sensors based on superconductivity and SQUIDs (Superconducting Quantum Interference Device). Sensors based on magnetoresistive elements MRE) are compact and easy to use with very simple read-out electronics. The characteristic feature of a SQUID based magnetometer is its ultrahigh sensitivity.

The operation of a magnetoresistive element (MRE) is based on the anisotropic magnetoresistance effect: the resistance of the magnetoresistor depends on the relative orientation angle between the probing current and the magnetization vector in the resistor material. A magnetizing field, H, applied in the plane of the thin film MRE causes the magnetization vector to rotate, and a relative resistance change $\Delta R_{max}/R$, typically about 2% is seen over a range of a few mT.

Recently MREs based on the so called "giant magnetoresistive effect" (GMR) have been demonstrated, for example spin valves consisting of two adjacent magnetic layers. In these GMR devices $\Delta R_{max}/R$-values as large as 15% have been documented.

The performance of a magnetic sensor is determined by its sensitivity to the magnetizing field, and the internal noise of the sensor. The sensitivity of a GMR element to magnetizing field, defined as $S=\Delta R/(R*\Delta H)$, is of the order of $10^{-4}$ m/A(corresponding to a resistance change of 0,8% per Oersted). The intrinsic noise level of the sensor is defined by converting the apparent resistance variations, $R_n$, due to an internal thermodynamic process into an equivalent field noise, $B_n$, using the definition of sensitivity. This leads to $B_n=\mu_0*H_n=\mu_0*R_n/(SR)$, where $\mu_0$ is the vacuum permeability.

When measuring a resistor there are two basic mechanisms of thermodynamic origin resulting in apparent resistance variations: the thermal voltage noise (white "Johnson noise") and the conductance fluctuations contributing to the so called 1/f noise dominating at low frequencies.

The spectral density of the white Johnson noise is $U_n=\sqrt{4kTR}$, where k is the Bolzmann constant and T the absolute temperature of the resistor. The field noise corresponding to this $U_n$ is $B_n=\mu_0*(U_n/U_0)/S$, where $U_0$ is the bias voltage of the MRE resistor. Assuming R=600 Ohms, T=300 K, and $U_0$=1 Volt we get $B_n=4*10^{-11}$ T/$\sqrt{}$ Hz. This gives the resolution in the white noise range of a magnetic sensor based on GMR.

The spectral density of the conductance fluctuations responsible for the intrinsic 1/f-noise, is described by the Hooge relation $\Delta R/R=(\gamma_H/N/f)^{1/2}$. Here N is a number proportional to the volume of the resistor. In several studies on the 1/f noise (F. N. Hooge in IEEE Transactions on Electron Devices, vol. 41, no. 11, 1994, and references therein) it has been shown that by identifying N with the total number of current carriers (conduction electrons) in the resistor a "Hooge constant", $\gamma_H$, can be defined, which is universal in the sense that it equals to $10^{-4}$ to $10^{-3}$ for most resistance materials relatively free of defects and impurities. For GMR elements Hooge constants of $6*10^{-3}$ have been measured at room temperature (based on an assumption of a free electron density of $1/(2*10^{-10} \text{ m})^3$). With these numbers a 1/f field-noise of $B_n=\mu_0*(\gamma_H/N/f)^{1/2}/S=5*10^{-10}$ T/$f^{1/2}$ is obtained for a typical size GMR element having length of 120 µm, width of 6 µm, and thickness of 50 nm.

By far the most sensitive magnetic sensors available at present are those based on superconductivity and SQUIDs. These sensors utilize two phenomena associated with superconductivity: the Josephson effect, and the Meissner effect.

The Josephson effect is a quantum mechanical interference effect characteristic to an electron system in the superconducting state. This state is achieved when the superconducting material is cooled to below its superconducting transition temperature $T_c$. For classical superconductors $T_c$ is less than 10 K. This cooling requirement, of course, limits the technical applicability of these magnetic sensors. The limitation is much less stringent if the recently discovered high-$T_c$ superconductors can be used. For these materials $T_c$ is higher than 50K, which is achievable by relatively simple cooling techniques.

The technical device utilizing the Josephson effect in measuring weak magnetic fields is called Superconducting Quantum Interference Device (SQUID). The apparent resistance of the SQUID depends periodically on the magnetic flux $\Phi_{SQ}=B*A_{SQ}$ flowing through the SQUID loop of area $A_{SQ}$. As compared to MREs, this dependence of resistance on the flux is very steep because the period of the resistance variation is extremely small, equal to a constant of nature called "flux quantum", $\Phi_0=2*10^{-15}$ Wb. Typically, for any SQUID $\Delta R/\Delta\Phi_{SQ}/R=\Delta U/\Delta\Phi_{SQ}/U$ is equal to a few times $1/\Phi_0$. It is this steep dependence of the resistance on the magnetic flux that is responsible for the superior sensitivity of the SQUID-based magnetic sensors.

The sensitivity of a SQUID to be compared with that of an MRE is $S=\Delta R/R/\Delta H=\mu_0*\Delta U/U/\Delta B=\mu_0(\Delta U/\Delta\Phi_{SQ}/U)*A_{SQ}$. Optimal internal noise properties are obtained with a SQUID loop having a rather low inductance, $L_{SQ}$, of the order of 10 pH, which requires a surface area $A_{SQ}$ as small as $10*10$ µm². Even for such a small SQUID the sensitivity is 0,1 m/A, which is by a factor 1000 better than the sensitivity of a GMR device.

Even this high sensitivity of the "bare" SQUID is not sufficient for the most demanding applications like biomagnetism, for example. Therefore, a flux transformer technique based on the Meissner effect is applied. The idea in this technique is to magnify the magnetic flux through the SQUID by effectively increasing the surface area of the sensor beyond the small $A_{SQ}$ of the bare SQUID-loop.

The flux transformer is simply a closed superconducting loop. As a manifestation of the Meissner effect a persistent current arises in such a loop when an effort is made to alter the magnetic flux flowing through the loop by any external source of magnetic field in the vicinity. This persistent current running in the loop does not decay with time but stays at the level needed to exactly compensate for the flux due to the external cause. In the flux transformer technique this current that is proportional to the momentary external magnetic flux through the relatively large flux transformer loop is inductively coupled to the SQUID-loop as effectively as possible.

The maximal flux transfer coefficient that can be obtained with the flux transformer technique is $T=\Phi_{SQ}/\Phi_{ft}=(L_{SQ}/2L_{ft})^{1/2}$, where $\Phi_{SQ}$ and $L_{SQ}$, and $\Phi_{ft}$ and $L_{ft}$ are the magnetic fluxes and inductances of the SQUID loop and the flux transformer loop, respectively. The best achievable SQUID sensitivity when using a flux transformer is the sensitivity of the bare SQUID multiplied by $T*A_{ft}/A_{SQ}$, where $A_{ft}$ is the area of the large pick-up coil of the flux transformer.

As mentioned above, to optimize the internal flux noise properties of the SQUID a low $L_{SQ}=10$ pH is preferred. On the other hand, to maximize the flux $\Phi_{ft}$, and thus the signal of the sensor a pick-up coil area $A_{ft}$ as large as possible is chosen. In the biomagnetic applications, for example, where the samples are large and extreme sensitivity is necessary, the diameter of the pick-up loop may be a couple of centimeters, so that $A_{ft}=4$ cm$^2$. Typically, this results in $L_{ft}=200$ nH, which means a rather large inductance mismatch between the flux transformer and the SQUID, thus limiting the maximal achievable flux transfer coefficient to as low as $7*10^{-3}$. In this example the total enhancement by factor $T*A_{ft}/A_{SQ}=28000$ over the sensitivity of the "bare" SQUID is obtained. This results in S=2800 m/A, a sensitivity by factor $3*10^7$ larger than that achievable with a GMR.

A modern low-Tc SQUID with $L_{SQ}=10$ pH has an intrinsic flux noise density of $\Phi_n=10^{-6}*\Phi_0/\sqrt{Hz}$. This limits the intrinsic field resolution of a SQUID based magnetometer utilizing a superconducting flux transformer with a 4 cm$^2$ pick-up coil area to $B_n=\Phi_n/T/A_n=10^{b-15}$ T/$\sqrt{Hz}$. In practical devices made for biomagnetic applications this resolution, obtained by assuming ideal inductive coupling, is not quite reached. A typical technically feasible number is rather 2 to $3*10^{-15}$ T/$\sqrt{Hz}$. This resolution is by factor $2*10^5$ better than the resolution achieved with a conventional GMR sensor.

The 1/f-noise spectral density of a SQUID+flux transformer-based magnetic sensor determined by the 1/f flux noise intrinsic to a 10 pH SQUID itself is of the order of 2 fT/f$^{1/2}$ if ideal inductive coupling is assumed and about 4 fT/f$^{1/2}$, assuming a technically feasible coupling.

The SQUID-based sensors of the prior art utilizing low temperature superconductors, like niobium, have an excellent noise performance, but the cryogenics technology required for cooling the sensors to the working temperature below $T_c$ is expensive and may even be impossible to implement in some applications. Relatively heavy dewars are a prerequisite of liquid helium based cryogenics. Cooling a geomagnetic flux-gate to liquid helium temperature every time the device is used in the field is not practical.

Consequently, a lighter technology based on high-Tc superconductors and liquid nitrogen as the cooling agent has been considered as a promising step forward in the field of ultrasensitive magnetic sensors. Biomagnetic sensors based on high-Tc SQUIDS with internal white noise performance in the range of 10 fT/$\sqrt{Hz}$ have been reported (ref.: Robin Cantor, Luke P. Lee, Mark Teepe, Vladimir Vinetskiy, and Joseph Longo, "Low Noise Single-Layer YBaCuO DC SQUID Magnetometers at 77 K, IEEE Transactions on Applied Superconductivity, vol 5, no. 2 June, 1995, pages 2927-2930).

The problems with the high-Tc SQUID technology are associated with the low yield, lack of chemical stability, and high price of the high-$T_c$ SQUIDs. Efficient mass production of high-$T_c$ SQUIDs is difficult because of the techniques used in making the weak links necessary for the quantum interference phenomenon. Whereas the weak links in the niobium SQUIDs are simply realized by a thin insulator layer between two niobium layers on top of each other similar multilayer structures of high-$T_c$ material have turned out to be difficult to make. The lack of multilayer high-$T_c$ technology also prevents the fabrication of efficient multiturn fluxtransformers.

Because of these technical limitations associated with the mass production of high-Tc SQUIDs, "hybrid" magnetic sensors based on combination of pick-up antennae made of a single layer high-$T_c$ film, and "bare" magnetic sensors, Hall sensors and GMRs, have been proposed in the prior art (Kaiser et al., Cryogenics 38, (1998), patents DE 19944586 C1, DE10041797).

The Cryogenics article introduces an idea of a high-$T_c$ superconducting pick-up loop coupled inductively to a Hall sensor fabricated by lithographic technique on the same substrate adjacent to the loop. To enhance the inductive coupling the pick-up loop is equipped with a narrow "incoupling line" next to the Hall sensor, and the superconducting contact leads of the Hall sensor are used to further guide the flux through the Hall element. By this construction a field gain by factor 100 is obtained for a 4*4 mm$^2$ pick-up loop. A sensitivity better than 20 pT/$\sqrt{Hz}$ above 100 Hz and better than 10 pT/$\sqrt{Hz}$ above 500 Hz is reported.

In the patent DE 19944586 C1 a reference is made to the Cryogenics article and the idea is further developed. The main claim defines a symmetrized gradiometer device utilizing a double loop pick-up coil and a Hall element symmetrically divided on both sides of the incoupling line. An idea of using the pick-up loop as one of the Hall electrodes is also introduced. The use of MRE or GMR is presented in a subclaim referring to the main claim on symmetrized device provided with a divided sensing element. The patent DE 10041797 refers to the preceding one and claims further refinement of the pick-up coil arrangement aiming at balancing the sensor against uniform magnetic field.

In all this prior art the magnetic sensor elements are located adjacent to the incoupling line, or in the gaps between the multiple antenna loops. This is the natural geometry enabling the use of Hall sensors: the amplified magnetic field is orthogonal to the plane of the Hall sensor.

SUMMARY OF THE INVENTION

The present invention aims at overcoming the abovementioned drawbacks and in particular at avoiding the use of Hall sensors or SQUIDs whilst allowing the production of a sensing device having comparable or better performances than the known magnetometers.

The invention further aims at providing a compact and reliable sensor of magnetic flux which is easy to produce and may be used in any magnetic sensor application including biomagnetic detection.

The invention further aims at improving the sensitivity of the sensing devices for sensing a magnetic field in different applications.

These aims are achieved due to a device for sensing a magnetic field, wherein it comprises a closed superconducting pick-up loop having a path width d etched out of a single layer superconducting thin film of thickness $e_1$, and provided with a constriction having a width w of narrow dimension smaller than said path width d, said closed superconducting pick-up loop constituting a flux-to-field transformer (FFDT), and wherein at least one magnetoresistive element is placed on top of or below said superconducting thin film, is isolated from said superconducting thin film by a thin insulating layer of thickness $e_4$ smaller than said width w, and is located so that an active part of the magnetoresistive element is at the location of the constriction and has a width $W_{GMR}$ equal to or less than the width w of the constriction, the active part of the magnetoresistive element being oriented so that the bias current in said active part is directed essentially along the constriction, orthogonally to the width w of narrow dimension.

Preferably, the magnetoresistive element is based on the giant magnetoresistive effect and constitutes a GMR resistor.

It may also consist of Tunneling Magnetoresistive (TMR) element or Colossal Magnetoresistive (CMR) element.

Advantageously, the superconducting pick-up loop is made of high-$T_c$ superconductor having a superconducting transition temperature $T_c$ higher than 50 K.

Thus cooling of the sensor to below 9 K is required if the loop is made of a material which is a low-Tc superconductor such as niobium, whereas cooling is required only to below values such as 50 to 90 K, e.g. 80 K if the pick-up loop is made of high-$T_c$ superconductors.

The magnetoresistive element has a thickness ($e_2$) of a few tens of nanometers.

According to a specific embodiment of the invention, the constriction of the pick-up loop is wounded in a coil, whose self induction is of the same order of magnitude (ideally equal) than the self induction of the rest of the pick-up loop constituting the receiving loop, said coil being wound around a core comprising a magnetoresistive bar constituting the field sensor.

Preferably, the constriction has a reduced width comprised between a few tenths of micrometer and a few micrometers.

According to a preferred embodiment, the circumferential path of the superconducting pick-up loop defines a circumferential path which is essentially a convex loop, like a square or a circle having a mean diameter D.

According to an advantageous embodiment, the superconducting pick-up loop is essentially a symmetrical double loop having a -eight shape and the constriction of the superconducting pick-up loop is located on the central common branch of the eight-shaped loop, defining two elementary flux-to-field transformers (FFDT).

Advantageously, the additional coil inductively coupled to the pick-up loop is a plane type coil only coupled to one of the elementary flux-to-field transformers.

According to a specific embodiment, the device according to the invention further comprises a negative feed-back loop having a feed-back current driven into an additional coil inductively coupled to the pick-up loop to counteract an external magnetic flux and to thus prevent the appearance of a Meissner current in the pick-up loop.

According to still another specific embodiment, the device according to the invention further comprises means for providing a negative feedback, said means comprising a normal metal bridge placed on top of the magnetoresistive element and means for driving a current through said normal metal bridge to create a flux density used to cancel the flux density caused by an induced Meissner current.

The mean diameter (D) of the circumferential path of the superconducting pick-up loop is comprised between a few millimeters and a few centimeters.

More specifically, the mean diameter (D) of the circumferential path of the superconducting pick-up loop is comprised between about 1 and 3 centimeters and the device is applied to biomagnetic detection.

The invention thus concerns an optimal way of combining a thin film superconductor loop with a magnetoresistive sensor into a hybrid sensor having a performance comparable to state of the art SQUID based magnetometers.

The hybrid sensor consists of a pick-up-loop patterned from a superconducting thin film and provided with a narrow incoupling line. The innovation of the present invention is based on the fact that whereas the signal of a SQUID or a Hall sensor is proportional to the total flux through these sensors the signal of a magnetoresistive element such as a GMR element is proportional to the magnetic flux density in the plane of the sensor. Thus, contrary to the case of SQUID and Hall sensor a large total flux is not needed because the GMR sensors are very thin, typically 50 nanometers thick. It is sufficient to place such a sensor at the "hot spot" where the flux density is at its maximum. When the GMR sensor having the same width as the incoupling line is placed directly on top of the incoupling line a high field gain efficiently controlled by choosing the width of the incoupling line is obtained. In this way one gets out of a single layer of thin film High-Tc superconductor a very efficient "flux-to-field transformer" (FFDT). No flux guiding structures such as the superconducting electrode planes characteristic to the prior art Hall devices are needed.

Because of the efficient inductive coupling geometry the field gain, obtained by a given incoupling line width, exceeds that of a superconducting loop+Hall sensor hybrid by a factor of ten. This results in a sensor performance comparable with the state of the art low-$T_c$ SQUID based sensors if magnetoresistive elements having a sensitivity of $6*10^{-4}$ (5% Oe) are available.

In the present invention a superconducting loop etched out of a single layer thin film is used as a FFDT that transforms the magnetic flux flowing through the pick-up loop into a high local field $B_{GMR}$ at a singular point on the circumference of the loop. The tiny GMR element is then placed at this "hot spot".

Contrary to the case of the flux transformers used in the SQUID-based devices of prior art where only less than 1% of the total flux of the flux transformer is transmitted through the SQUID loop, the FFDT is able to enhance the magnetic field locally at the site of the GMR element roughly by a factor of $B_{GMR}/B_0 = (\pi \text{ to } \pi/2)*(D/w_{GMR})$, where D is the mean diameter of the superconducting loop and $w_{GMR}$ is the common width of the narrow incoupling line and of the GMR element sitting on top of this constriction.

For the large FFDT-loops where D=2 to 3 cm that can be used in the biomagnetic application the field enhancement $B_{GMR}/B_0$ can be of the order of 10000, if for example $w_{GMR}=4$ μm. This results in a corresponding enhancement in the sensitivity as compared to using a "bare" GMR. If, in addition to the field gain, the reduction in the thermal voltage noise—resulting from the cooling of the GMR from 300 to 80 K—is taken into account, a resolution of the GMR in the white noise regime is improved to $B_n=5*10^{-15}$ T/√Hz, which would be sufficient even for the biomagnetic application.

It is possible to reduce the 1/f-noise, by a modulation of the AC current and by choosing a working point for the GMR where the second derivative of R(H) is maximal. In that case, low frequency fluctuations are measured around the second harmonics of the AC frequency. The improvement is the suppression of the 1/f noise with a decrease of the sensitivity by a factor about 4.

In the flux gate applications where larger field variations must be dealt with and the extreme fT-level sensitivity is not necessary a smaller size FFDT with a wider constriction can be used. In this way the working range of the sensor can be moved toward higher fields. The dynamic range will stay the same because an FFDT with smaller loop and wider constriction tolerates a higher flux without exceeding the critical current of the constriction.

The sensitivity of 1 pT/$\sqrt{Hz}$, can still be achieved with devices as small as 10 µm about in diameter. This exceeds the sensitivity of the prior art flux-gates by a factor of more than ten. The frequency range covered by the sensor ranges from DC to an upper limit determined by the speed of the reading electronics.

The dynamic range may be further modified by using negative feedback. In this technique a flux density associated with a current driven through a normal metal bridge on top of the GMR element is used to cancel the flux density caused by the induced Meissner current. In this case the dynamic range and sensitivity of the device is determined by those of the current source used for feedback.

BRIEF DESCRIPTION OF THE DRAWINGS

These and other objects and features of the present invention will become clearer from the following description of specific embodiments given by way of example with reference to the accompanying drawings, in which.

DETAILED DESCRIPTION OF PREFERRED EMBODIMENTS

Figure 1:
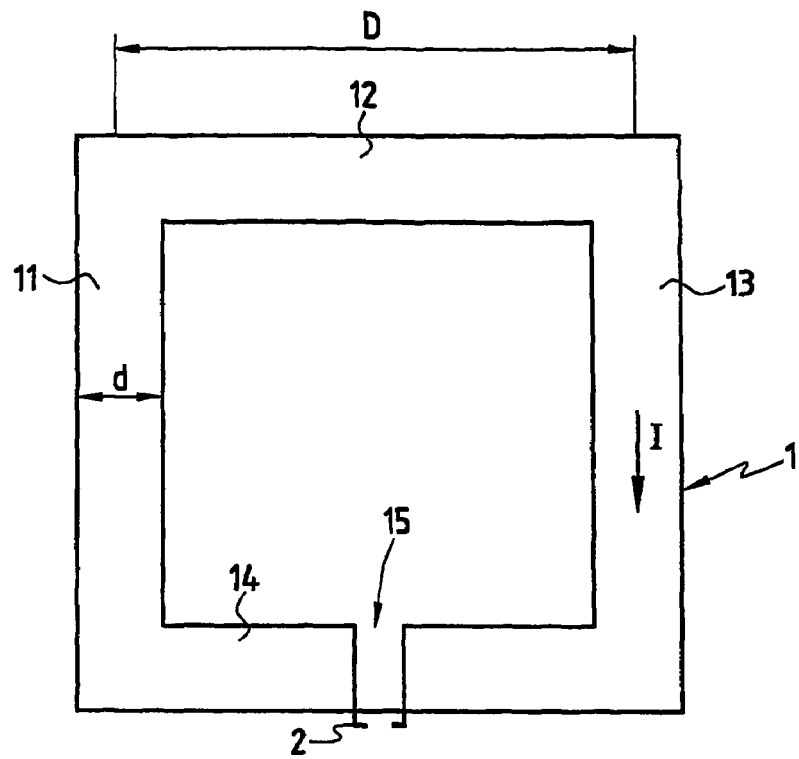
FIG. 1 is a schematic view of an example of a sensor according to the invention with a square shaped superconducting flux guide loop provided with a narrow constriction.

The physical working principle and basic design of a magnetic sensor based on the present invention is shown in FIG. 1. The superconducting flux guide 1 consists of a square shaped closed loop lithographically etched out of, for example, a high-Tc superconductor thin film. The loop comprises a circumferential path with a first branch 12, two lateral branches 11, 13 and a fourth branch 14 which is parallel to the first branch 12.

A change $\Delta B$ in the magnetic field component perpendicular to the plane of the loop 1 induces a change $\Delta I$ in the persistent current I circulating in the loop 1. The magnitude of $\Delta I$ is determined by the requirement that the total flux through the closed superconducting loop stays constant (Meissner effect). Therefore, $\Delta I = \Delta B * A_{FFDT}/L_{FFDT}$, where $A_{FFDT}$ and $I_{FFDT}$ are the surface area and inductance of the loop 1.

The inductance of a square shaped loop of superconducting thin film is $L_{FFDT} = (\mu_0/2\pi) * D * [Ln(4D/d) - 2.35]$ (see FIG. 1). To simplify the formulas below we choose $d = 0.14 * D$, whence $L_{FFDT} = (\mu_0/2\pi) * D$.

D which is called the mean diameter of the loop represents in this example the distance between two parallel branches 11, 13 of the circumferential path of the square-shaped superconducting pick-up loop 1. D may be comprised between a few millimeters and a few centimeters.

The width d of the branches 11, 12, 13, 14 of the circumferential path of the pick-up loop 1 is related to D and as explained above may be for example chosen as $d = 0.14 * D$.

The circumferential path of the pick-up loop 1 has a small thickness $e_1$, e.g. a few tens of nanometers.

The pick-up loop 1 constitutes a flux-to-field transformer (FFDT) loop having a portion 15 that transforms the magnetic flux flowing through the pick-up loop 1 into a high local magnetic field at a singular point on the circumferential path of the superconducting pick-up loop 1.

Figure 2:
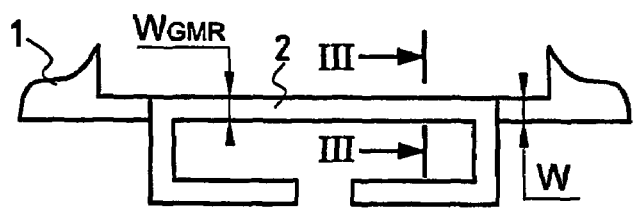
FIG. 2 is an enlarged view of a portion of the sensor of FIG. 1 showing a close-up of the constriction with a GMR element on top of it.
Figure 3:
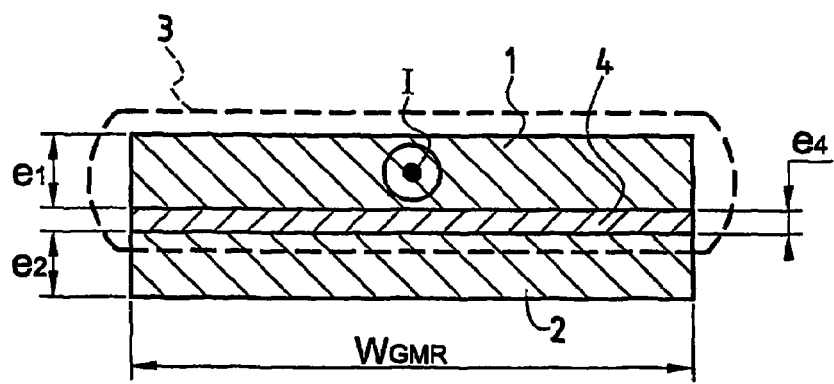
FIG. 3 is a cut view along line III-III of FIG. 2 showing at the level of the constriction the GMR element on top of the superconductor separated from it by an insulator thin film

At least one magnetoresistive element 2 such as a GMR element is placed on top of the singular point constituting a narrow constriction 15 having a width w<<d (FIGS. 1 to 3) and the magnetoresistive element 2 is isolated by a thin insulating layer 4 of thickness $e_4$ which is smaller than the width w and also preferably smaller than the thickness $e_1$ of the superconducting film 1 and/or the thickness $e_2$ of the magnetoresistive element 2.

The narrow constriction 15 having a strongly reduced width w compared to the defined path width d is formed in the complete thickness $e_1$ of the circumferential path of the loop 1 and the magnetoresistive element 2 is located on the top of the constriction 15 of the reduced width.

The magnetoresistive element 2 is located so that the active part of the magnetoresistive element 2 is at the location of the constriction 15 and has a width $W_{GMR}$ equal to or less than the width w of the constriction 15. The active part of the magnetoresistive element 2 is oriented so that the bias current in the active part is directed essentially along the constriction 15, orthogonal to the width w of narrow dimension.

The narrow constriction 15 can be located at any technically convenient location on the circumference of the FFDT-loop. Usually, the loop has a rectangular shape and the narrow constriction is located towards the middle of one of the great sides.

The yoke-type shape embodiment of the GMR-element 2 is a standard design used in MREs to stabilize the magnetization pattern. The active area of the element, having a resistance R, is the middle section between the biasing electrodes 3. This area is chosen some distance away from the corners to, make sure it is free of magnetic domain walls. This is to avoid extra resistance fluctuations arising from moving magnetic walls.

The positioning of the GMR element 2 on top of the constriction 15 may be done mechanically, if it is on a different substrate or, preferably, it may be patterned by using lithographic technique directly on top of the constriction 15. The latter method guarantees an optimal tight coupling to the FFDT-loop. Alternatively, the magnetoresistive element 2 may be placed below the superconducting thin film 1.

The GMR element 2 contains high permeability material, with $\mu_r = 8000$, typically. Deposition of even a small amount of such material on top of the FFDT-loop will increase the inductance of the loop by an amount $L_{GMR}$, and result in a decrease of the induced $\Delta I$. $L_{GMR}$ is proportional to the volume of the GMR element, which should therefore be kept reasonably small. On the other hand the amplitude of the 1/f voltage noise associated with the conductance fluctuations is proportional to the inverse square root of the volume of the active area of the GMR resistor. The optimal signal to noise ratio at low frequencies is thus obtained with a GMR so large that $L_{GMR}=L_{FFDT}$, so that the current change induced by the change in field, $\Delta B$, is reduced to $\Delta I=\Delta B*A_{FFDT}/(2*L_{FFDT})$.

By Ampere's law the circulation of the magnetic field around a closed path is equal to $\mu_0$ times the total current through the loop of the path. When this is applied to the closed path 3 in FIG. 3, having a total length of approximately $2*w_{GMR}$, the change in the magnetic field at the location of the GMR element 2, as a response to $\Delta B$ through the loop, is approximately $$\Delta B_{GMR}=\mu_0*\Delta I/(2*w_{GMR})=\mu_0*A_{FFDT}/(4*L_{FFDT}*w_{GMR})*\Delta B=(\pi/2)*(D/w_{GMR})*\Delta B,$$

when a square shaped FFDT-loop is assumed ($A_{FFDT}=D^2$).

The resulting field gain factor $(\pi/2)*(D/w_{GMR})$ for a given size of FFDT-loop is controlled by choosing the width $w_{GMR}$. For a large loop with D=2 cm applicable in biomagnetic detection the gain factor can be as large as 10000. This is an important advantage of the present invention.

The magnetoresistive element 2 may have a thickness $e_2$ of a few tens of nanometers.

Figure 4:
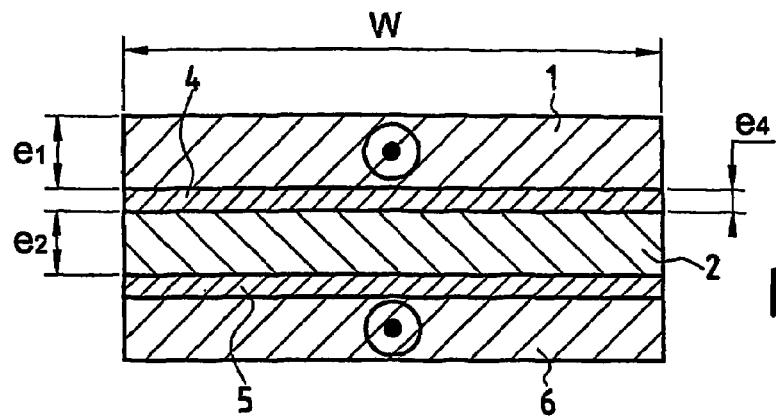
FIG. 4 is a cut view similar to the cut view of FIG. 3 at the level of a constriction corresponding to a variant embodiment where a negative feedback technique is used.

The dynamic range may be further modified by using negative feedback. As shown in FIG. 4, the flux density associated with a current driven through a normal metal bridge 6 on top of the GMR element 2 is used to cancel the flux density caused by the induced Meissner current. An insulating layer 5 is deposited in between to avoid electrical contact. In this case the dynamic range and sensitivity of the device is determined by those of the current source used for feedback.

One may also provide the device with negative feed-back by a feed-back current driven into an additional coil equivalent to bridge 6 and inductively coupled to the FFDT-loop to counteract the external magnetic flux and to thus prevent the appearance of the Meissner current in the FFDT-loop.

Figure 5:
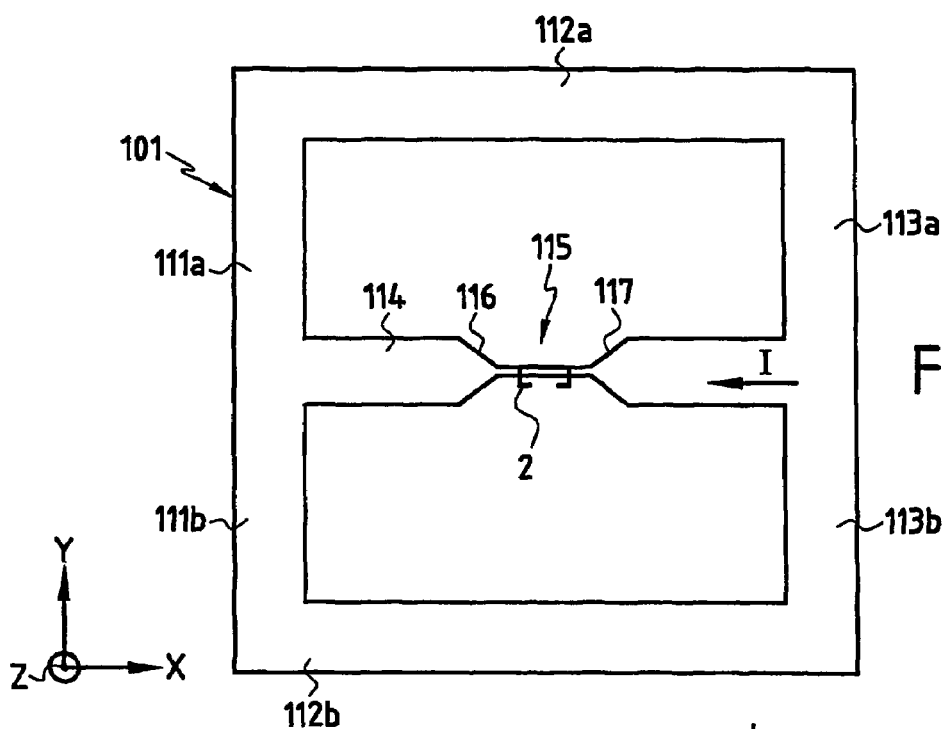
FIG. 5 is a schematic view of another example of sensor according to the invention with a superconducting flux guide consisting of two symmetric loops.

A variant of an FFDT geometry intended for measurement of the gradients of the magnetic field is a symmetrical double loop having a eight shape whose each of the two elementary loops is a square, and the constriction settles in the portion of conductor common to those two elementary loops, as shown in FIG. 5. This kind of a sensor results in a better signal to noise ratio in conditions where signals from sources at a short distance are to be resolved from large background fields arising from sources far away.

The superconducting flux guide 101 of FIG. 5 consists of two elementary symmetric loops. In this geometry, the current running through the constriction 115 in the center branch 114 is proportional to the Gradient $\partial B_z/\partial y$ of the magnetic field.

Thus in the embodiment of FIG. 5, the superconducting pick-up loop 101 is essentially a symmetrical double loop having a eight shape and the portion 115 at a singular point of the pick-up loop 101 is located on the central common branch 114 of the eight-shaped pick-up loop 101.

On FIG. 5, the "upper" loop comprises an upper branch 112a, two parallel lateral branches 111a, 113a which may define a distance D or "mean diameter" as on FIG. 1 and the common branch 114 which is parallel to the upper branch 112a.

The "lower" loop comprises a lower branch 112b, two parallel lateral branches 117h, 113b which are extensions of branches 111a, 113a and the common branch 114 which is parallel to the lower branch 112b.

The path width d of branches 111a, 111b, 112a, 112b, 113a, 113b, 114 is defined as a function of D as explained with reference to FIG. 1 in connection with loop 1.

The width w of the constriction 115 is much smaller than the path width d as also previously explained with reference to FIG. 1 in connection with constriction 15.

The features of the magnetoresistive element 2 located on top of the constriction 115 are similar to the features of the magnetoresistive element 2 of FIG. 1 and will not be repeated. The explanations given with reference to FIGS. 2 to 4 thus apply also to the embodiment of FIG. 5.

However, as shown on FIG. 5, the constriction 115 is designed in such a manner that the pick-up loop 101 is symmetrical. The constriction 115 is thus arranged at mid-height of the path width d in the common branch 114. Moreover, the portions 114, 117 of the common branch 114 contiguous to the constriction 115 preferably have a V-shape.

Thus the sensor according to the invention may sense a very small magnetic field with a magnetoresistive element 2 located at the level of the constriction 115 which is common to the loops of the eight-shaped loop 101 without any need for delocalizing such transducer.

In case of need, two or more magnetoresistive elements 2 may be located along the constriction 15 (FIG. 1) or 115 (FIG. 5) whose length should be adapted accordingly.

One may combine the FFDT geometry intended for measurement of the gradients of the magnetic field, as shown on FIG. 5, with the above negative feed-back device using an additional coil inductively coupled to the FFDT pick-up loop. In this case, the additional coil must be not symmetrically coupled to the two elementary loops of the gradient sensor. In a preferred embodiment, this additional coil is a plane type one, positioned in a plane parallel to FFDT plane, and only coupled to one of the FFDT elementary loops. For instance, it is a single turn coil covering one fourth of one of the elementary FFDT loops. The negative feedback loop having a feed back current driven into the additional coil inductively coupled to the pick-up loop as mentioned above counteracts the external magnetic flux and thus prevents the appearance of a Meissner current in the FFDT pick-up loop.

Figure 6:
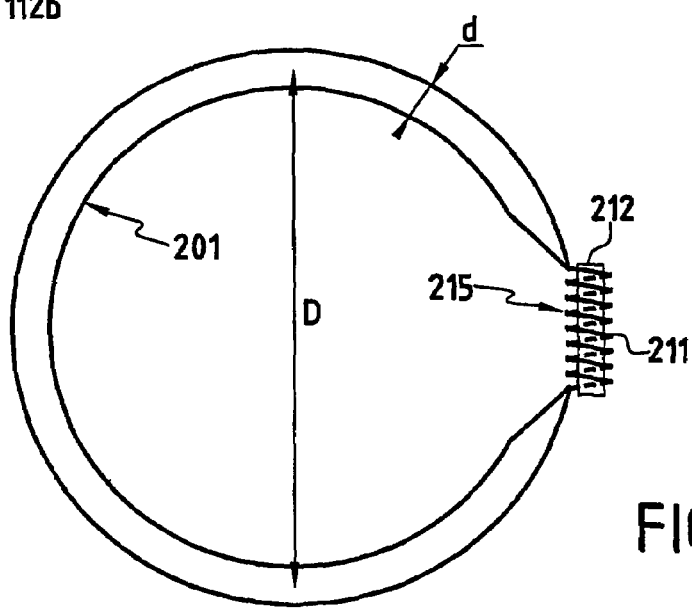
FIG. 6 is a schematic view of another example of sensor according to the invention with a superconducting constriction extended and wired around a magnetoresistive element.

FIG. 6 relates to another embodiment of the present invention and shows how the constriction 215 can be elongated to a wire 211 and wounded around a magnetoresistive element 212 constituting a bar, either with lithography techniques or mechanically. The coil 211 may be made of a wire having a smaller diameter than the main coil (not shown) cooperating with the superconducting pick-up loop 201 to allow a higher number of turns. In lithography techniques, the number of turns is limited. The number of turns has also to be limited so that the inductance of the wound constriction 211 does not exceed too much the inductance of the rest of the main loop 201.

FIG. 6 shows a superconducting pick-up loop 201 comprising a circumferential path which essentially defines a ring or circle having a mean diameter D and a path width d which is substantially greater than the diameter of the wire 211 of the coil defining the constriction 215.

The invention claimed is:

1. A device for sensing a magnetic field, wherein it comprises a closed superconducting pick-up loop having a path width (d) etched out of a single layer superconducting thin film of thickness ($e_1$), and provided with a constriction having a width (w) of narrow dimension smaller than said path width (d), said closed superconducting pick-up loop constituting a flux-to-field transformer (FFDT), and wherein at least one magnetoresistive element is placed on top of or below said superconducting thin film, is isolated from said superconducting thin film by a thin insulating layer of thickness ($e_4$) smaller than said width (w), and is located so that an active part of the magnetoresistive element is at the location of the constriction and has a width ($W_{GMR}$) equal to or less than the width (w) of the constriction, the active part of the magnetoresistive element being oriented so that the bias current in said active part is directed essentially along the constriction, orthogonally to the width (w) of narrow dimension.

2. A device according to claim 1, wherein it further comprises a negative feed-back loop having a feed-back current driven into an additional coil inductively coupled to the pick-up loop to counteract an external magnetic flux and to thus prevent the appearance of a Meissner current in the pick-up loop.

3. A device according to claim 2, wherein the additional coil inductively coupled to the pick-up loop is a plane type coil only coupled to one of the elementary flux-to-field transformers.

4. A device according to claim 1, wherein the magneto resistive element is designed in a yoke type shape.

5. A device according to claim 1, wherein the constriction of the pick-up loop is wound in a coil, whose self induction is of the same order of magnitude than the self induction of the rest of the pick-up loop constituting the flux-receiving loop, said coil being wound around a core comprising a magnetoresistive bar constituting the field sensor.

6. A device according to claim 1, wherein the superconducting pick-up loop is made of high-Tc superconductor having a superconducting transition temperature Tc higher than 50 K.

7. A device according to claim 1, wherein the superconducting pick-up loop is made of low-Tc superconductor.

8. A device according to claim 1, wherein the ratio D/w of the mean diameter (D) of the pick-up loop and the width (w) of the constriction, determining the gain of the flux-to-field transformer (FFDT) is optimally chosen so that a maximal gain is obtained without causing a critical current of the constriction to be exceeded in the intended operation environment of the sensor.

9. A device according to claim 1, wherein the magnetoresistive element has a thickness (e2) of a few tens of nanometers.

10. A device according to claim 1, wherein said constriction has a reduced width (w) comprised between a few tenths of micrometer and a few micrometers.

11. A device according to claim 1, wherein the magnetoresistive element is based on the giant magnetoresistive effect and constitutes a GMR resistor.

12. A device according to claim 11, wherein:
the magneto resistive element is designed in a yoke type shape;
the constriction of the pick-up loop is wound in a coil, whose self induction is of the same order of magnitude than the self induction of the rest of the pick-up loop constituting the flux-receiving loop, said coil being wound around a core comprising a magnetoresistive bar constituting the field sensor;
the superconducting pick-up loop is made of high-Tc superconductor having a superconducting transition temperature Tc higher than 50 K;
the superconducting pick-up loop is made of low-Tc superconductor;
the ratio D/w of the mean diameter (D) of the pick-up loop and the width (w) of the constriction, determining the gain of the flux-to-field transformer (FFDT) is optimally chosen so that a maximal gain is obtained without causing a critical current of the constriction to be exceeded in the intended operation environment of the sensor;
the magnetoresistive element has a thickness (e2) of a few tens of nanometers;
said constriction has a reduced width (w) comprised between a few tenths of micrometer and a few micrometers;
the superconducting pick-up loop defines a circumferential path which is essentially a convex loop like a square or a circle having a mean diameter (D);
the superconducting pick-up loop comprises a symmetrical double loop having a eight shape and the constriction of the superconducting pick-up loop is located on the central common branch of the eight-shaped ioop defining two elementary flux-to-field transformers (FFDT);
the mean diameter (D) of the circumferential path of the superconducting pick-up loop is comprised between a few millimeters and a few centimeters;
the mean diameter (D) of the circumferential path of the superconducting pick-up loop is comprised between about 1 and 3 centimeters and wherein it is applied to biomagnetic detection.

13. A device according to claim 12, wherein it further comprises a negative feed-back loop having a feed-back current driven into an additional coil inductively coupled to the pick-up loop to counteract an external magnetic flux and to thus prevent the appearance of a Meissner current in the pick-up loop.

14. A device according to claim 13, wherein the additional coil inductively coupled to the pick-up loop is a plane type coil only coupled to one of the elementary flux-to-field transformers.

15. A device according to claim 12, wherein it further comprises means for providing a negative feedback, said means comprising a normal metal bridge placed on top of the magnetoresistive element and means for driving a current through said normal metal bridge to create a flux density used to cancel the flux density caused by an induced Meissner current.

16. A device according to claim 1, wherein the magnetoresistive element is a tunneling magnetoresistive element (TMR) or a colossal magnetoresistive element (CMR).

17. A device according to claim 16, wherein:
the magneto resistive element is designed in a yoke type shape;
the constriction of the pick-up ioop is wound in a coil, whose self induction is of the same order of magnitude than the self induction of the rest of the pick-up loop constituting the flux-receiving loop, said coil being wound around a core comprising a magnetoresistive bar constituting the field sensor;
the superconducting pick-up loop is made of high-Tc superconductor having a superconducting transition temperature Tc higher than 50 K;
the superconducting pick-up loop is made of low-Tc superconductor;
the ratio D/w of the mean diameter (D) of the pick-up loop and the width (w) of the constriction, determining the gain of the flux-to-field transformer (FFDT) is optimally chosen so that a maximal gain is obtained without causing a critical current of the constriction to be exceeded in the intended operation environment of the sensor;

the magnetoresistive element has a thickness (e2) of a few tens of nanometers;

said constriction has a reduced width (w) comprised between a few tenths of micrometer and a few micrometers;

the superconducting pick-up loop defines a circumferential path which is essentially a convex loop like a square or a circle having a mean diameter (D);

the superconducting pick-up loop comprises a symmetrical double loop having a eight shape and the constriction of the superconducting pick-up loop is located on the central common branch of the eight-shaped loop defining two elementary flux-to-field transformers (FFDT);

the mean diameter (D) of the circumferential path of the superconducting pick-up loop is comprised between a few millimeters and a few centimeters;

the mean diameter (D) of the circumferential path of the superconducting pick-up loop is comprised between about 1 and 3 centimeters and wherein it is applied to biomagnetic detection.

18. A device according to claim 17, wherein it further comprises a negative feed-back loop having a feed-back current driven into an additional coil inductively coupled to the pick-up loop to counteract an external magnetic flux and to thus prevent the appearance of a Meissner current in the pick-up loop.

19. A device according to claim 18, wherein the additional coil inductively coupled to the pick-up loop is a plane type coil only coupled to one of the elementary flux-to-field transformers.

20. A device according to claim 17, wherein it further comprises means for providing a negative feedback, said means comprising a normal metal bridge placed on top of the magnetoresistive element and means for driving a current through said normal metal bridge to create a flux density used to cancel the flux density caused by an induced Meissner current.

21. A device according to claim 1, wherein it further comprises means for providing a negative feedback, said means comprising a normal metal bridge placed on top of the magnetoresistive element and means for driving a current through said normal metal bridge to create a flux density used to cancel the flux density caused by an induced Meissner current.

22. A device according to claim 1, wherein the superconducting pick-up loop defines a circumferential path which is essentially a convex loop like a square or a circle having a mean diameter (D).

23. A device according to claim 22, wherein the superconducting pick-up loop is essentially a symmetrical double loop having a eight shape and the constriction of the superconducting pick-up loop is located on the central common branch of the eight-shaped loop defining two elementary flux-to-field transformers (FFDT).

24. A device according to claim 22, wherein the mean diameter (D) of the circumferential path of the superconducting pick-up loop is comprised between a few millimeters and a few centimeters.

25. A device according to claim 15, wherein the mean diameter (D) of the circumferential path of the superconducting pick-up loop is comprised between about 1 and 3 centimeters and wherein it is applied to biomagnetic detection.

* * * * *

UNITED STATES PATENT AND TRADEMARK OFFICE
CERTIFICATE OF CORRECTION

PATENT NO. : 7,342,396 B2
APPLICATION NO. : 10/543982
DATED : March 11, 2008
INVENTOR(S) : Myriam Pannetier et al.

It is certified that error appears in the above-identified patent and that said Letters Patent is hereby corrected as shown below:

Column 3, line 34, "$B_n = \Phi_n/T/A_{ft} = 10^{b-15}$ T/√Hz." should read --$B_n = \Phi_n/T/A_{ft} = 10^{-15}$ T/√Hz.--;

Column 4, line 62, "d" should read --$\underline{d}$--;

Column 4, line 64, "w" should read --$\underline{w}$--;

Column 4, line 65, "d" should read --$\underline{d}$--;

Column 5, line 4, "w" should read --$\underline{w}$--;

Column 5, line 7, "w" should read --$\underline{w}$--;

Column 5, line 10, "w" should read --$\underline{w}$--;

Column 5, line 41, "-eight" should read --eight--;

Column 6, line 31, "(5%Oe)" should read --(5%/Oe)--;

Column 8, line 8, "d" should read --$\underline{d}$--;

Column 8, line 13, "$e_1$" should read --$\underline{e}_1$--;

Column 8, line 28, "d" should read --$\underline{d}$--;

Column 8, line 50, "to," should read --to--;

Column 9, line 60, "111a, 113a" should read --111$\underline{a}$, 113$\underline{a}$--;

Column 9, line 63, "112a" should read --112$\underline{a}$--;

Column 9, line 64, "112b" should read --112$\underline{b}$--;

Column 9, line 65, "117h, 113b" should read --117$\underline{b}$, 113$\underline{b}$--;

Column 9, line 66, "111a, 113a" should read --111$\underline{a}$, 113$\underline{a}$--;

Column 9, line 67, "112b" should read --112$\underline{b}$--;

UNITED STATES PATENT AND TRADEMARK OFFICE
CERTIFICATE OF CORRECTION

PATENT NO. : 7,342,396 B2
APPLICATION NO. : 10/543982
DATED : March 11, 2008
INVENTOR(S) : Myriam Pannetier et al.

It is certified that error appears in the above-identified patent and that said Letters Patent is hereby corrected as shown below:

Column 10, line 1, "d" should read --d--;

Column 10, line 1, "111a, 111b, 112a, 112b," should read --111a, 111b, 112a, 112b,--;

Column 10, line 2, "113a, 113b," should read --113a, 113b,--;

Column 10, line 5, "d" should read --d--;

Column 10, line 15, "d" should read --d--;

Column 10, line 57, "d" should read --d--;

Column 11, line 53, claim 12, "magneto resistive" should read --magnetoresistive--;

Column 12, line 17, claim 12, "ioop" should read --loop--;

Column 12, line 50, claim 17, "ioop" should read --loop--; and

Column 14, line 27, claim 25, "15" should read --24--.

Signed and Sealed this

Third Day of November, 2009

David J. Kappos
*Director of the United States Patent and Trademark Office*